12) United States Patent
Kettler et al.

(10) Patent No.: US 10,514,584 B2
(45) Date of Patent: Dec. 24, 2019

(54) OPTICAL SIGNAL GENERATOR COMPRISING A PHASE SHIFTER

(71) Applicant: SICOYA GMBH, Berlin (DE)

(72) Inventors: Thorsten Kettler, Berlin (DE); Stefan Meister, Berlin (DE); Sven Otte, Hohen-Neuendorf (DE)

(73) Assignee: Sicoya GmbH, Berlin (DE)

( * ) Notice: Subject to any disclaimer, the term of this patent is extended or adjusted under 35 U.S.C. 154(b) by 0 days.

(21) Appl. No.: 15/674,424

(22) Filed: Aug. 10, 2017

(65) Prior Publication Data

US 2019/0049816 A1    Feb. 14, 2019

(51) Int. Cl.
*G02F 1/035*    (2006.01)
*G02F 1/225*    (2006.01)
(Continued)

(52) U.S. Cl.
CPC ......... *G02F 1/2257* (2013.01); *G02B 6/4206* (2013.01); *G02F 1/0147* (2013.01); *G02F 2001/212* (2013.01)

(58) Field of Classification Search
CPC .. G02F 1/225; G02F 2001/212; G02F 1/2257; G02F 1/025; G02F 1/2255; G02F 1/035
See application file for complete search history.

(56) References Cited

U.S. PATENT DOCUMENTS

| 6,912,193 | B2* | 6/2005 | Cho | B82Y 10/00 |
| | | | | 369/126 |
| 8,110,963 | B2* | 2/2012 | Funasaka | G01H 11/08 |
| | | | | 310/322 |

(Continued)

FOREIGN PATENT DOCUMENTS

| DE | 10 2011 005 422 A1 | 9/2012 |
| DE | 102015208983 A1 | 11/2016 |

(Continued)

OTHER PUBLICATIONS

Doerr, Christopher R. (2015): Silicon photonic integration in telecommuni- cations. In: Front. Phys. 3, S. 952. DOI: 10.3389/fphy.2015.00037.

(Continued)

*Primary Examiner* — Jennifer Doan
(74) *Attorney, Agent, or Firm* — Gordon Rees Scully Mansukhani, LLP (57) ABSTRACT

An embodiment of the invention relates to an optical signal generator comprising an optical emitter configured to generate a beam of optical radiation, a first and second beam deflecting element, a modulator being located between the beam deflecting elements, a phase shifter located between the beam deflecting elements, a control unit configured to control the phase-shift of the phase shifter, wherein the first and second beam deflecting elements, the phase shifter and the modulator are located in the same plane, wherein the beam generated by the optical emitter is angled relative to said plane, wherein said first beam deflecting element is configured to deflect the emitter's beam into the plane towards the modulator, said modulator being configured to modulate the emitter's radiation and outputting a modulated radiation, wherein said second beam deflecting element is configured to deflect the modulated radiation off the plane towards an output port of the signal generator, wherein the modulator is configured to modulate the emitter's radiation in response to an electrical data signal that is applied to the modulator and comprises a data stream, and wherein the control unit is configured to generate a control signal in order to control the phase-shift of the phase shifter and in order to avoid or reduce an impact of reflected radiation on the emitter's emission characteristic.

26 Claims, 10 Drawing Sheets

(51) Int. Cl.
*G02B 6/42* (2006.01)
*G02F 1/01* (2006.01)
*G02F 1/21* (2006.01)

(56) References Cited

U.S. PATENT DOCUMENTS

| | | |
|---|---|---|
| 9,267,923 B2 * | 2/2016 | Urey .................... G01N 29/022 |
| 9,318,868 B2 | 10/2016 | Creazzo et al. |
| 2005/0249509 A1 | 11/2005 | Nagarajan et al. |
| 2008/0128587 A1 | 6/2008 | Lyu et al. |
| 2010/0020840 A1 | 1/2010 | Hayakawa |
| 2015/0036964 A1 | 2/2015 | Okano et al. |
| 2017/0098922 A1 | 4/2017 | Hatori et al. |
| 2017/0207600 A1 | 7/2017 | Klamkin et al. |
| 2017/0250755 A1 | 8/2017 | Kawata |

FOREIGN PATENT DOCUMENTS

| | | |
|---|---|---|
| EP | 2 980 618 A1 | 10/2014 |
| JP | 09-269428 | 10/1997 |

OTHER PUBLICATIONS

International Search Report and Written Opinion dated Nov. 26, 2018 issued in International Application No. PCT/EP2018/070415; filed Jul. 27, 2018.

A.M.J.Koonen et at; "Silicon Photonic Integrated Mode Multiplexer and Demultiplexer"; IEEE Photonics Technology Letters; vol. 24; No. 21; Nov. 1, 2012; pp. 1961-1964.

Alberto Scandurra et al.; "Optical Interconnects for Network on Chip"; Nano-Networks and Workshops; 2006 IEEE; Sep. 1, 2006; pp. 1-5, XPO31076876.

* cited by examiner

OPTICAL SIGNAL GENERATOR COMPRISING A PHASE SHIFTER

The invention relates to optical signal generators, methods of operating optical signal generators and methods of fabricating optical signal generators.

BACKGROUND OF THE INVENTION

An optical signal generator is described for instance in U.S. Pat. No. 9,318,868 B2. This document describes a tunable laser that includes a substrate comprising a silicon material, a gain medium coupled to the substrate, wherein the gain medium includes a compound semiconductor material, and a waveguide disposed in the substrate and optically coupled to the gain medium. The tunable laser also includes a first wavelength selective element characterized by a first reflectance spectrum and disposed in the substrate and a carrier-based phase modulator optically coupled to the first wavelength selective element. The tunable laser further includes a second wavelength selective element characterized by a second reflectance spectrum and disposed in the substrate, an optical coupler disposed in the substrate and optically coupled to the first wavelength selective element, the second wavelength selective element, and the waveguide, and an output mirror.

Objective of the Present Invention

An objective of the present invention is to provide an optical signal generator that has a good emission characteristic and comparably low fabrication costs.

A further objective of the present invention is to provide a method of operating an optical signal generator such that it provides a good emission characteristic.

A further objective of the present invention is to provide a method of fabricating an optical signal generator that has a good emission characteristic.

BRIEF SUMMARY OF THE INVENTION

An embodiment of the invention relates to an optical signal generator comprising an optical emitter configured to generate a beam of optical radiation, a first and second beam deflecting element, a modulator being located between the beam deflecting elements, a phase shifter located between the beam deflecting elements, a control unit configured to control the phase-shift of the phase shifter, wherein the first and second beam deflecting elements, the phase shifter and the modulator are located in the same plane, wherein the beam generated by the optical emitter is angled relative to said plane, wherein said first beam deflecting element is configured to deflect the emitter's beam into the plane towards the modulator, said modulator being configured to modulate the emitter's radiation and outputting a modulated radiation, wherein said second beam deflecting element is configured to deflect the modulated radiation off the plane towards an output port of the signal generator, wherein the modulator is configured to modulate the emitter's radiation in response to an electrical data signal that is applied to the modulator and comprises a data stream, and wherein the control unit is configured to generate a control signal in order to control the phase-shift of the phase shifter and in order to avoid or reduce an impact of reflected radiation on the emitter's emission characteristic.

The above exemplary embodiment of the invention can be fabricated at relatively low costs since the first beam deflecting element, the modulator, the phase shifter and the second beam deflecting element lie in the same plane. Further, the above embodiment addresses the problem, that the first beam deflecting element, the modulator and/or the second beam deflecting element may reflect radiation and generate reflected radiation. This reflected radiation may travel back to the emitter and deteriorate the emission characteristic of the emitter. The control unit may generate a control signal in order to avoid or reduce reflected radiation or at least the impact of reflected radiation on the emitter's emission characteristic.

The output port of the signal generator can be formed directly by an output port of the second beam deflecting element. Alternatively, the output port of the signal generator can be separated from the output port of the second beam deflecting element, for instance by a lens, or a backend or backend layers of a semiconductor chip. In the latter case, the first and second beam deflecting elements and the modulator are preferably integrated in the semiconductor chip.

The cut-off frequency of the phase shifter may be smaller than the cut-off frequency of the modulator. More specifically, the cut-off frequency of the phase shifter may be at least a thousand times smaller than the cut-off frequency of the modulator.

The phase shifter preferably comprises a thermal element capable of shifting the phase on the basis of the thermo-optic effect.

The optical signal generator may comprise a monitor detector for generating a monitor signal that is proportional to the emitter's radiation or at least characterizes the emitter's radiation. The control unit may be configured to control the phase-shift of the phase shifter such that a predefined characteristic of the monitor signal and therefore of the emitter's radiation remains inside a predefined range.

The control unit is preferably configured to control the phase-shift of the phase shifter such that the intensity of the monitor signal remains inside a predefined intensity range.

A bandpass filter having a center wavelength is preferably located upstream the monitor detector. The bandpass filter may help to direct the impact of the phase shifter towards the central wavelength of the emitter.

The monitor detector is preferably configured to detect a portion of the emitter's radiation.

The monitor detector is preferably connected to or coupled with a radiation path that extends from the first beam deflecting element to the second beam deflecting element.

Alternatively, the first and/or second beam deflecting element may comprise a monitor output and the monitor detector may be optically coupled with the monitor output.

According to another embodiment, the signal generator may comprise a memory where a target value, preferably a single target value, is stored. The control unit is preferably configured to control the phase-shift of the phase shifter according to the stored target value. In the latter embodiment the optimal phase-shift of the phase shifter, an optimal control voltage that causes the optimal phase-shift, or an optimal control current that causes the optimal phase-shift, may have been determined during the fabrication of the signal generator. The stored target value preferably describes the optimal phase-shift of the phase shifter, the optimal control voltage and/or the optimal control current.

Further, according to yet another embodiment, the signal generator may comprise a temperature sensor. The control unit may be configured to control the phase-shift of the phase shifter as a function of a temperature value provided by the temperature sensor.

The signal generator may comprise a memory that stores a look-up table. The look-up table may define a target phase-shift depending on the actual temperature value of the temperature sensor.

In the latter embodiment, the target phase-shifts may have been determined for different temperatures during the fabrication of the signal generator and stored in the memory or its look-up table.

At least one phase shifter may be located downstream the modulator and configured to shift the phase of radiation that is reflected by the second beam deflecting element.

At least one phase shifter may be located upstream the modulator and configured to shift the phase of radiation that is reflected by both the modulator and the second beam deflecting element.

The first beam deflecting element is preferably a first grating that is arranged inside said plane. The emitter's radiation is preferably directed towards the first grating at an input angle between 10° and 30° with respect to the perpendicular of said plane. The grating period of the first grating is preferably configured for coupling the emitter's radiation into said plane. The coupling efficiency of the first grating is preferably at least 30% at the emitter's wavelength range and said input angle range.

The second beam deflecting element is preferably a second grating that is arranged inside said plane. The second grating preferably has a grating period for out-of-plane coupling at an output angle between 10° and 30° with respect to the perpendicular of said plane. The coupling efficiency of the second grating is preferably at least 30% at the emitter's wavelength range and said output angle range.

The first and second beam deflecting elements and the modulator are preferably integrated in the same semiconductor chip.

The emitter is preferably a laser that is flip-chip mounted on said semiconductor chip.

Alternatively, the emitter may be a laser that is mounted on said semiconductor chip by means of a submount.

The optical emitter is preferably a continuous wave laser.

The first and second beam deflecting elements and the modulator preferably share the same waveguiding silicon layer.

The modulator may be a Mach-Zehnder modulator. 3 dB couplers of the Mach-Zehnder modulator are preferably MMI couplers.

However, in accordance with another preferred embodiment, the modulator may alternatively be an electro-optic modulator for the modulation of the optical radiation of a predetermined wavelength. The electro-optic modulator preferably has at least one optical resonator in which a standing optical wave can be formed for the predetermined wavelength. In the resonator, preferably at least two doped semiconductor sections, as seen in the longitudinal direction of the resonator, are arranged at a distance from one another. Preferably, the at least two doped semiconductor sections respectively lie locally at an intensity minimum of the standing optical wave. A waveguide consisting of semiconductor material is preferably present in the resonator. The longitudinal direction of the waveguide preferably extends along the longitudinal direction of the resonator. The at least two doped semiconductor sections may be respectively formed by a doped semiconductor section of the waveguide.

The signal generator may comprise two or more phase shifters located between the first and second beam deflecting elements. Each of two or more phase shifters is preferably controlled individually.

The optical signal generator may further comprise a lens that is located in the beam path between the emitter and the first beam deflecting element and/or a lens that is located in the beam path between the second beam deflecting element and an output port. The lenses are preferably formed in at least one backend layer of the semiconductor chip.

A further embodiment of the present invention relates to a method of operating an optical signal generator that comprises an optical emitter, a first and second beam deflecting element, a phase shifter, and a modulator being located between the beam deflecting elements, wherein the first and second beam deflecting elements, the phase shifter and the modulator are located in the same plane. The optical emitter generates a beam of optical radiation, said beam being angled relative to the plane. The first beam deflecting element deflects the emitter's beam into the plane towards the modulator. The modulator modulates the emitter's radiation and outputs a modulated radiation. The second beam deflecting element deflects the modulated radiation off the plane towards an output port of the signal generator. The phase shifter that is located in said plane between the first and second beam deflecting elements, is controlled to avoid or reduce an impact of reflected radiation on the emitter's output characteristic.

The phase-shift of the phase shifter is preferably controlled such that a predefined characteristic of a monitor signal of the optical signal generator remains inside a predefined range.

According to a preferred embodiment, the phase shifter is controlled such that the amplitude of a sum signal that consists of radiation reflected by the first beam deflecting element, radiation reflected by the modulator and radiation reflected by the second beam deflecting element, is minimal.

According to another preferred embodiment, the phase shifter is controlled such that the phase of a sum signal that consists of radiation reflected by the first beam deflecting element, radiation reflected by the modulator and radiation reflected by the second beam deflecting element, is in-phase with the emitter's output radiation at the emitter's output port.

The phase may be controlled based on a look-up table, preferably in response to a measured temperature value.

Yet a further embodiment of the present invention relates to a method of fabricating an optical signal generator comprising the steps of fabricating an optical emitter, a first and second beam deflecting element, a phase shifter being located between the beam deflecting elements, and a modulator being located between the beam deflecting elements, wherein the first and second beam deflecting elements, the phase shifter and the modulator are located in the same plane, wherein the optical emitter is configured to generate a beam of optical radiation, said beam being angled relative to the plane, wherein the first beam deflecting element is configured to deflect the emitter's beam into the plane towards the modulator, wherein the modulator is configured to modulate the emitter's radiation and output a modulated radiation, wherein the second beam deflecting element is configured to deflect the modulated radiation off the plane towards an output port of the signal generator, wherein during the fabrication, an optimal phase of the phase shifter that avoids or reduces an impact of reflected radiation on the emitter's output characteristic, is determined and wherein the corresponding control signal that generates said optimal phase for the phase shifter is stored in a control unit.

The output port of the signal generator can be formed directly by an output port of the second beam deflecting element. Alternatively, the output port of the signal generator can be separated from the output port of the second beam deflecting element by one or more further components, for instance a lens, a backend or backend layers of a semiconductor chip.

During the fabrication, the optimal phase that avoids or reduces an impact of reflected radiation on the emitter's output characteristic, may be determined. For instance, the optimal phase may be determined at different temperatures and the corresponding control signals for the phase shifter may be stored for further usage in a look-up table of the control unit as a function of the corresponding temperature value or with reference to the corresponding temperature value.

BRIEF DESCRIPTION OF THE DRAWINGS

In order that the manner in which the above-recited and other advantages of the invention are obtained will be readily understood, a more particular description of the invention briefly described above will be rendered by reference to specific embodiments thereof which are illustrated in the appended drawings. Understanding that these drawings depict only typical embodiments of the invention and are therefore not to be considered to be limiting of its scope, the invention will be described and explained with additional specificity and detail by the use of the accompanying drawings in which.

DETAILED DESCRIPTION OF THE PREFERRED EMBODIMENTS

The preferred embodiments of the present invention will be best understood by reference to the drawings. It will be readily understood that the present invention, as generally described and illustrated in the figures herein, could vary in a wide range. Thus, the following more detailed description of the exemplary embodiments of the present invention, as represented in the figures, is not intended to limit the scope of the invention, as claimed, but is merely representative of presently preferred embodiments of the invention.

Figure 1:
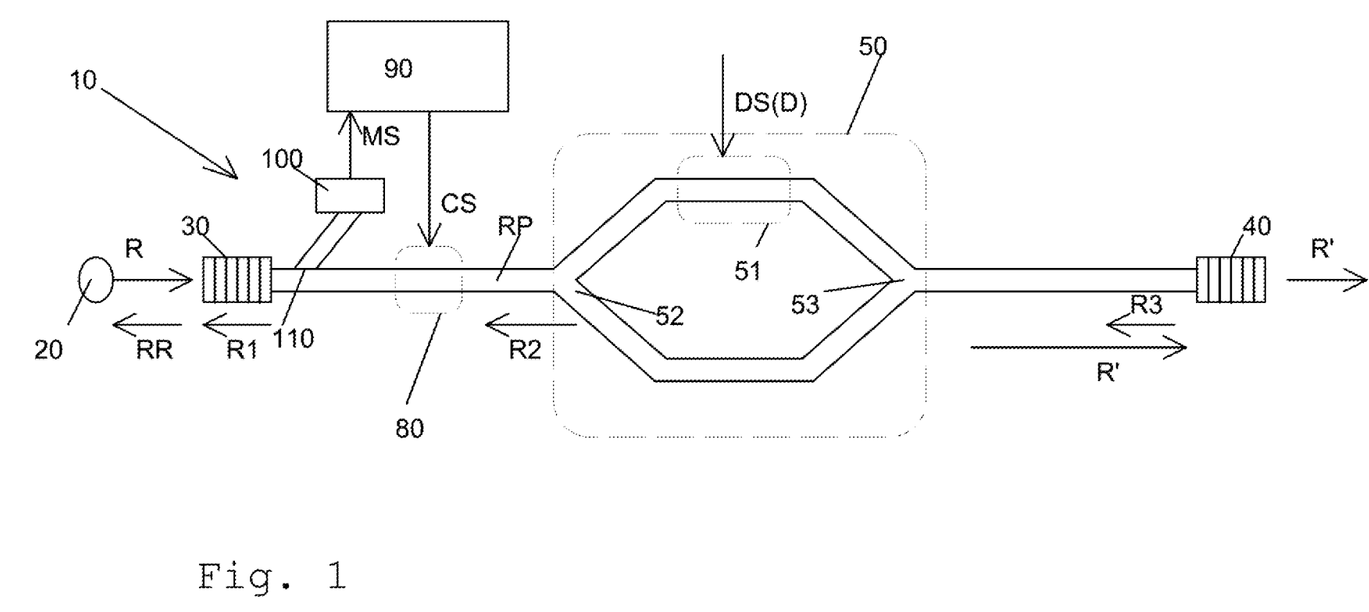
FIG. 1 illustrates a first exemplary embodiment of an optical signal generator in a top view.
Figure 2:
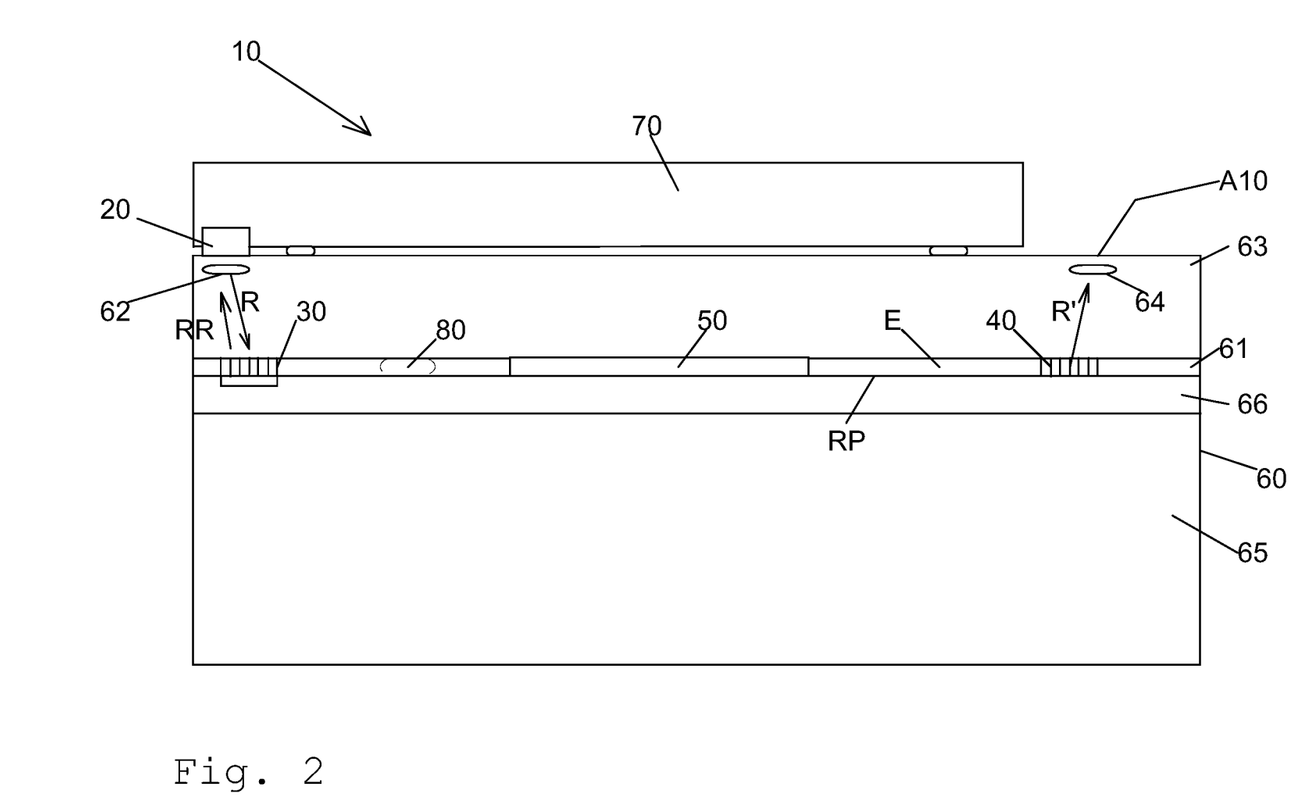
FIG. 2 illustrates a cross-section of the embodiment of FIG. 1, FIG. 3-8 illustrate further exemplary embodiments of optical signal generators in a top view.

FIGS. 1 and 2 show a first exemplary embodiment of an optical signal generator 10 according to the present invention. FIGS. 1 and 2 show a top view and a cross-section, respectively.

The optical signal generator 10 comprises an optical emitter 20 that generates a beam of optical radiation R, a first beam deflecting element 30, a second beam deflecting element 40, and a modulator 50. The modulator 50 is located between the beam deflecting elements 30 and 40.

The first and second beam deflecting elements 30 and 40 as well as the modulator 50 are located in the same plane E.

In the exemplary embodiment of FIGS. 1 and 2, the first and second beam deflecting elements 30, 40 and the modulator 50 share the same waveguiding silicon layer 61 of the same semiconductor chip 60. The semiconductor chip 60 may be based on SOI (silicon on insulator) material, which comprises a silicon substrate 65, a buried oxide layer 66 on top of the substrate 65, and a silicon layer on top of the buried oxide layer. The latter silicon layer preferably forms the waveguiding silicon layer 61.

The emitter 20 may be a laser that is flip-chip mounted on the semiconductor chip 60. For instance, the emitter 20 may be mounted on the semiconductor chip 60 by means of a submount 70. The optical emitter 20 is preferably a continuous wave laser.

The emitter's radiation R may be directed towards the first beam deflecting element 30 at an input angle between 10° and 30° with respect to the perpendicular of the plane E. The deflecting element 30 may be a grating that comprises a grating period for coupling the emitter's radiation into the plane E. The coupling efficiency of the first beam deflecting element 30 is preferably at least 30% at the emitter's wavelength range and the input angle between 10° and 30°.

The modulator 50 modulates the emitter's radiation R and outputs a modulated radiation R'. The modulator 50 modulates the emitter's radiation R in response to an external electrical data signal DS(D) that is applied to a carrier injection or depletion unit 51 (e.g. a pin-diode or pn-diode) of the modulator 50. The data signal DS(D) carries a data stream D. The electrical data signal DS(D) and the data rate of the data stream D may be in the GHz-range.

The second beam deflecting element 40 is preferably a grating that has a grating period for out-of-plane coupling of the modulated radiation R' towards an output port A10 of the signal generator 10. The output angle is preferably between 10° and 30° with respect to the perpendicular of the plane E. The coupling efficiency of the second beam deflecting element 40 is preferably at least 30% at the emitter's wavelength range and the output angle between 10° and 30°.

A lens 62 may be located in the beam path between the emitter 20 and the first beam deflecting element 30. The lens 62 may be formed in at least one backend layer 63 of the backend of the semiconductor chip 60.

Further, a lens 64 may be located in the beam path between the second beam deflecting element 40 and the output port A10 of the signal generator 10. The lens 64 may be formed in the at least one backend layer 63 of the semiconductor chip 60.

The optical signal generator 10 further comprises a phase shifter 80 and a control unit 90. The control unit 90 generates a control signal CS that controls the phase-shift that is induced by the phase shifter 80. The phase shifter 80 may comprise a thermal element capable of shifting the phase on the basis of the thermo-optic effect.

In the exemplary embodiment of FIGS. 1 and 2, the phase shifter 80 is located upstream the modulator 50, namely between the modulator 50 and the first beam deflecting element 30.

The first beam deflecting element 30, the modulator 50 and the second beam deflecting element 40 may reflect radiation and generate reflected radiation RR. The reflected radiation RR may travel back to the emitter 20 and deteriorate the emission characteristic of the emitter 20.

In order to avoid or reduce reflected radiation RR or at least the impact of reflected radiation RR on the emitter's emission characteristic and the emitter's radiation R, the control unit 90 generates the control signal CS. Since the phase shifter 80 is located upstream the modulator 50, the phase shifter 80 can shift the phase of reflected radiation that is generated by both the second beam deflecting element 40 and the modulator 50.

Assuming, for instance, that the first beam deflecting element 30 generates reflected radiation R1, the modulator 50 reflected radiation R2 and the second beam deflecting element 40 reflected radiation R3, the phase shifter 80 can shift the phase such that the reflected radiations R2 and R3 overlap with the reflected radiation R1 in a destructive way such that the resulting reflective radiation RR becomes minimal:

$$|RR|=|R1-(R2+R3)|\rightarrow \text{minimal}.$$

This way of shifting the phase is particularly advantageous if R1>>R2 and R3>>R2. Then, the emitter 20 may even see no significant reflected radiation RR at all.

Alternatively, the phase shifter 80 can shift the phase such that the overlapped reflected radiations R2+R3 arrive at the emitter 20 with an optimal phase. This way of shifting the phase is particularly advantageous if one of the components, for instance the modulator 50 or the second beam deflecting element 40, causes most of the reflected radiation (i.e. R2>>R1,R3 or R3>>R1,R2).

The cut-off frequency of the phase shifter 80 may be much smaller, for instance at least a thousand times smaller, than the cut-off frequency of the modulator 50.

In the exemplary embodiment of FIGS. 1 and 2, the optical signal generator 10 comprises a monitor detector 100 for generating a monitor signal MS that is proportional to the emitter's radiation R or at least characterizes the emitter's radiation R. The monitor detector 100 is connected to or coupled with a radiation path RP that extends from the first beam deflecting element 30 to the second beam deflecting element 40. The monitor detector detects just a small portion (preferably less than 10%) of the emitter's radiation R. The coupling element 110 in FIG. 1 is designed accordingly.

The control unit 90 controls the phase-shift of the phase shifter 80 such that a predefined characteristic of the monitor signal MS and therefore of the emitter's radiation R remains inside a predefined range. For instance, the control unit 90 controls the phase-shift of the phase shifter 80 such that the intensity of the monitor signal MS remains inside a predefined intensity range.

Figure 3:
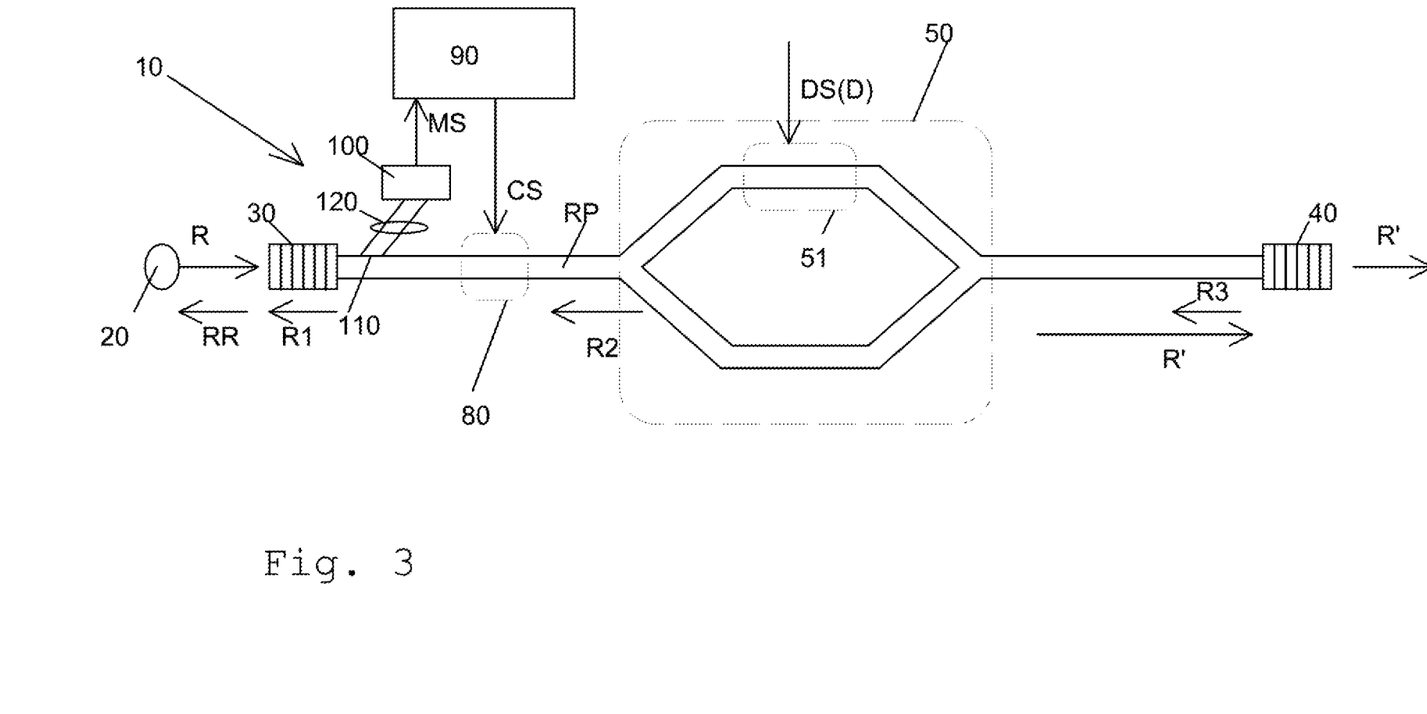

FIG. 3 shows a second exemplary embodiment of an optical signal generator 10 according to the present invention. The optical signal generator 10 of FIG. 3 comprises a bandpass filter 120 that is located upstream the monitor detector 100. The bandpass filter 120 has a center wavelength that corresponds to the center wavelength of the emitter's wavelength range. The bandpass filter 120 makes sure that the impact of the control unit 90 and the impact of the phase shifter 80 is primarily directed towards the central wavelength of the emitter.

The other general explanations above with respect to the embodiment according to FIGS. 1 and 2 apply to the embodiment of FIG. 3 correspondingly.

Figure 4:
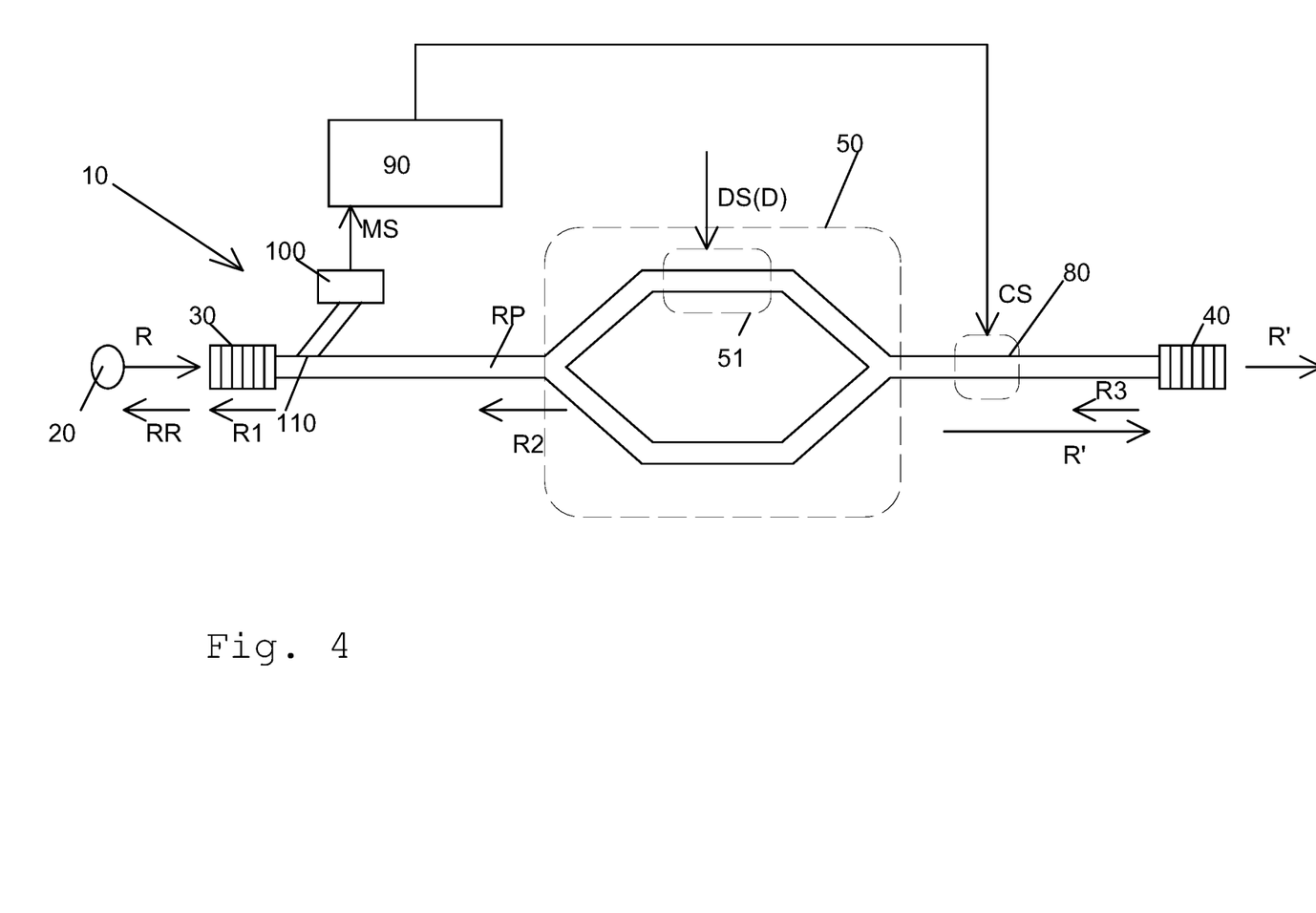

FIG. 4 shows a third exemplary embodiment of an optical signal generator 10 according to the present invention. In the exemplary embodiment of FIG. 4, the phase shifter 80 is located downstream the modulator 50, namely between the modulator 50 and the second beam deflecting element 40. Since the phase shifter 80 is located downstream the modulator 50, the phase shifter 80 can only shift the phase of reflected radiation R3 that is generated by the second beam deflecting element 40.

For instance, the phase shifter 80 can shift the phase such that the reflected radiation R3 overlaps with the reflected radiations R1 and R2 in a destructive way such that the resulting reflective radiation RR is minimal:

$$|RR|=|R1+R2-R3|\rightarrow \text{minimal}.$$

Alternatively, the phase shifter 80 can shift the phase such that the radiation R3 arrives at the emitter 20 with an optimal phase. This way of shifting the phase is particularly advantageous if the second beam deflecting element 40 causes most of the reflected radiation (i.e. R3>>R1 or R3>>R2).

The other general explanations above with respect to the embodiment according to FIGS. 1 and 2 apply to the embodiment of FIG. 4 correspondingly.

Figure 5:
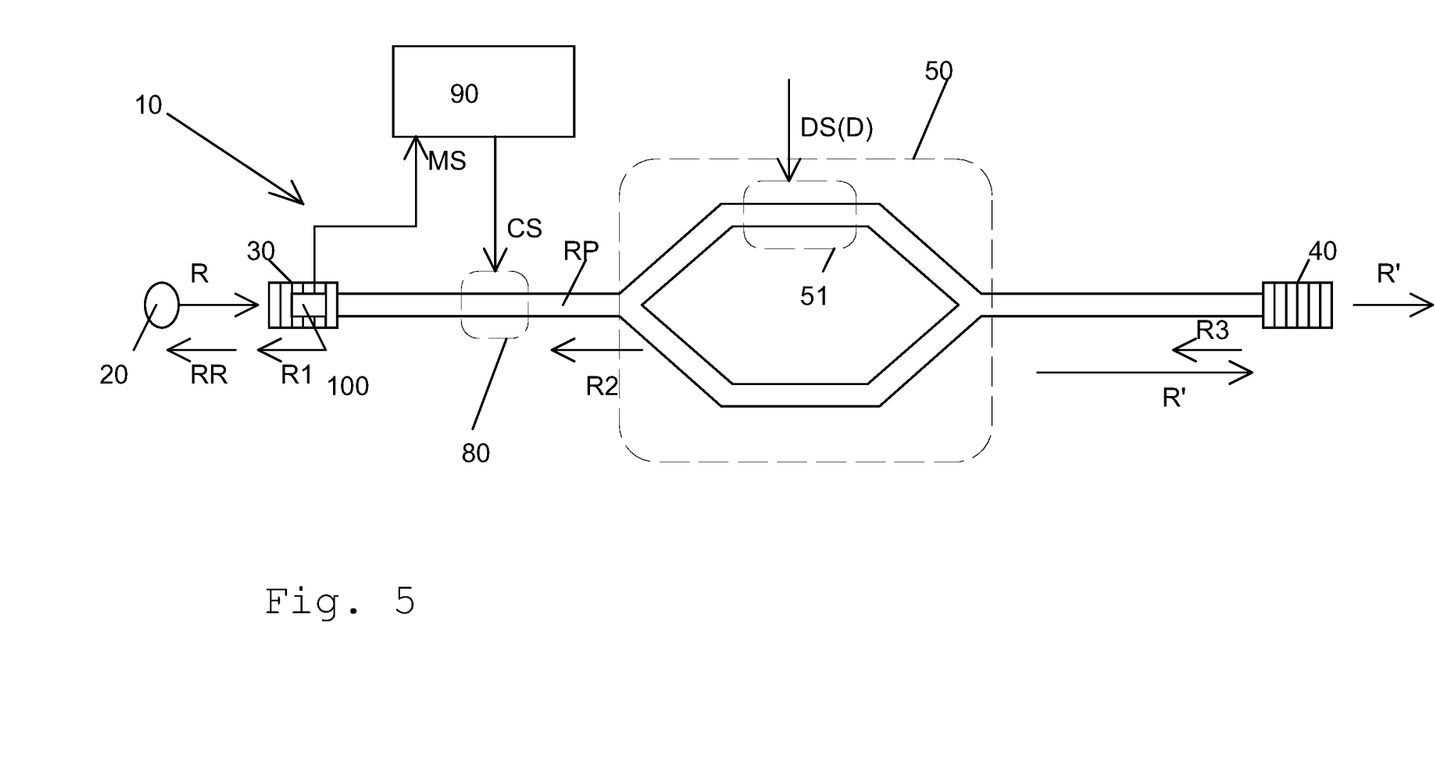

FIG. 5 shows a fourth exemplary embodiment of an optical signal generator 10 according to the present invention. In the exemplary embodiment of FIG. 5, the first beam deflecting element 30 has a monitor output. The monitor detector 100 is optically coupled with the monitor output.

The other general explanations above with respect to the embodiment according to FIGS. 1 and 2 apply to the embodiment of FIG. 5 correspondingly.

Figure 6:
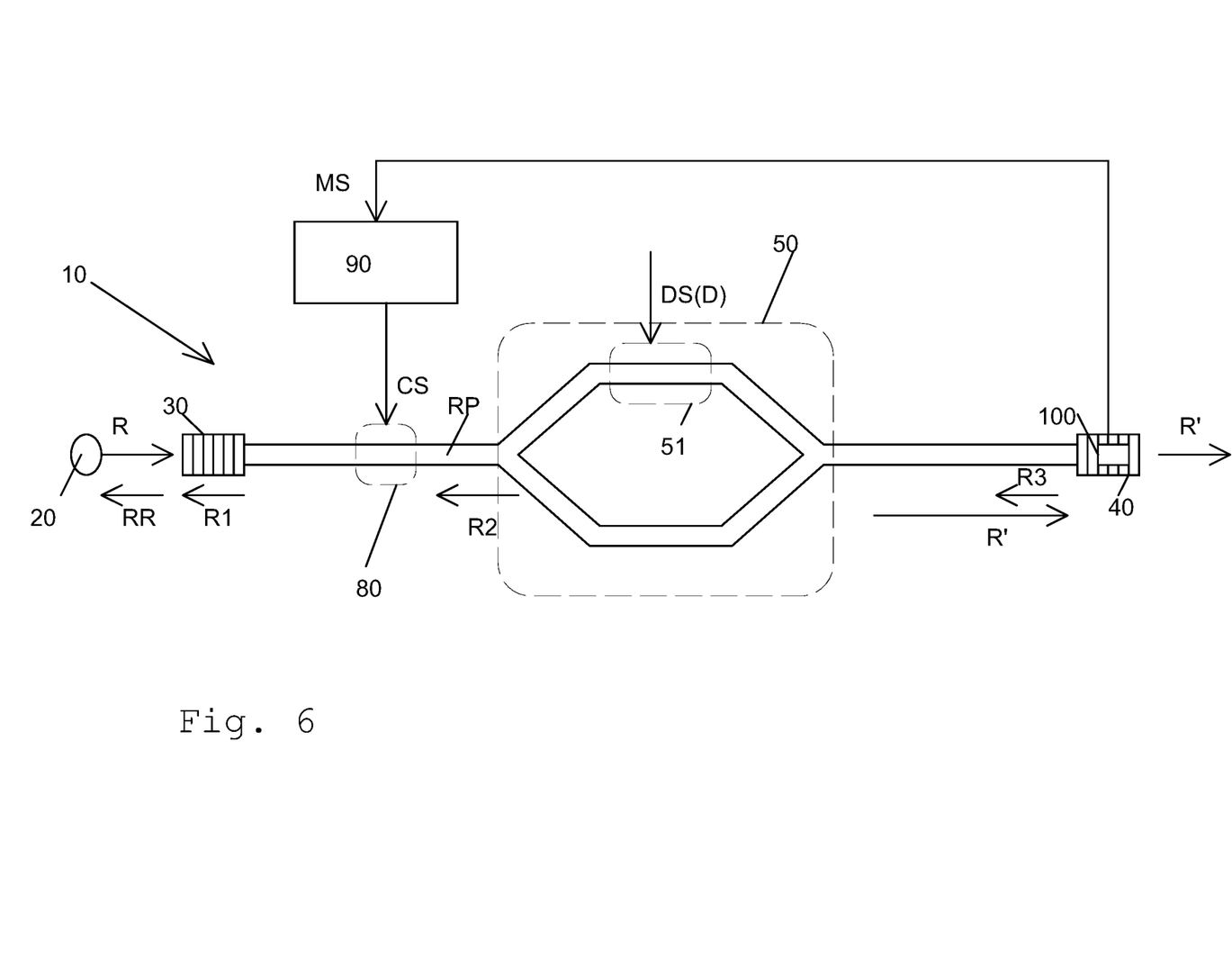

FIG. 6 shows a fifth exemplary embodiment of an optical signal generator 10 according to the present invention. In the exemplary embodiment of FIG. 6, the second beam deflecting element 40 has a monitor output and the monitor detector 100 is optically coupled with the monitor output.

The other general explanations above with respect to the embodiment according to FIGS. 1 and 2 apply to the embodiment of FIG. 6 correspondingly.

Figure 7:
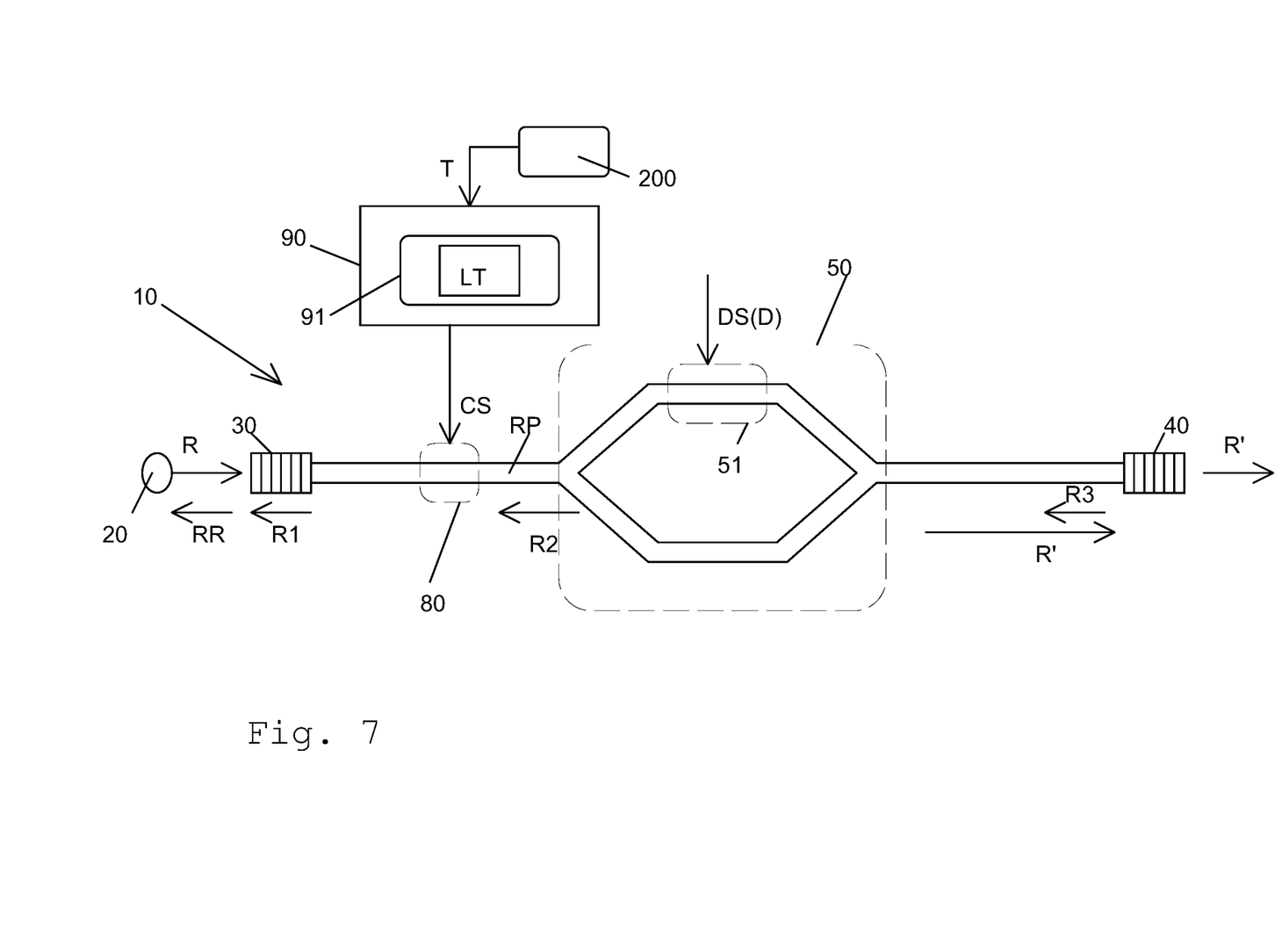

FIG. 7 shows a sixth exemplary embodiment of an optical signal generator 10 according to the present invention. In the exemplary embodiment of FIG. 7, the optical signal generator 10 comprises a temperature sensor 200 that is connected with the control unit 90. The control unit 90 controls the phase-shift of the phase shifter 80 as a function of a temperature value T that is provided by the temperature sensor 200.

To this end, the control unit 90 comprises a memory 91 that stores a look-up table LT. The look-up table LT defines a target phase-shift of the phase shifter 80 depending on the actual temperature value T of the temperature sensor 200. The control unit 90 generates the control signal CS according to the corresponding target value stored in the memory 91.

The look-up table LT and its target phase-shifts have been determined and stored in the memory 91 during the fabrication of the optical signal generator 10. The target phase shifts are chosen such that any impact of reflected radiation RR on the emitter's emission characteristic is minimal.

During the fabrication of the optical signal generator 10 the emitter's emission characteristic may have been measured by an external monitor detector for different phase shifts and different temperatures. In this way, the optimal phase shifts may have been determined for each temperature within the possible temperature range of the optical signal generator 10. The optimal phase shifts and the corresponding control signals CS are stored in the memory 91.

Figure 8:
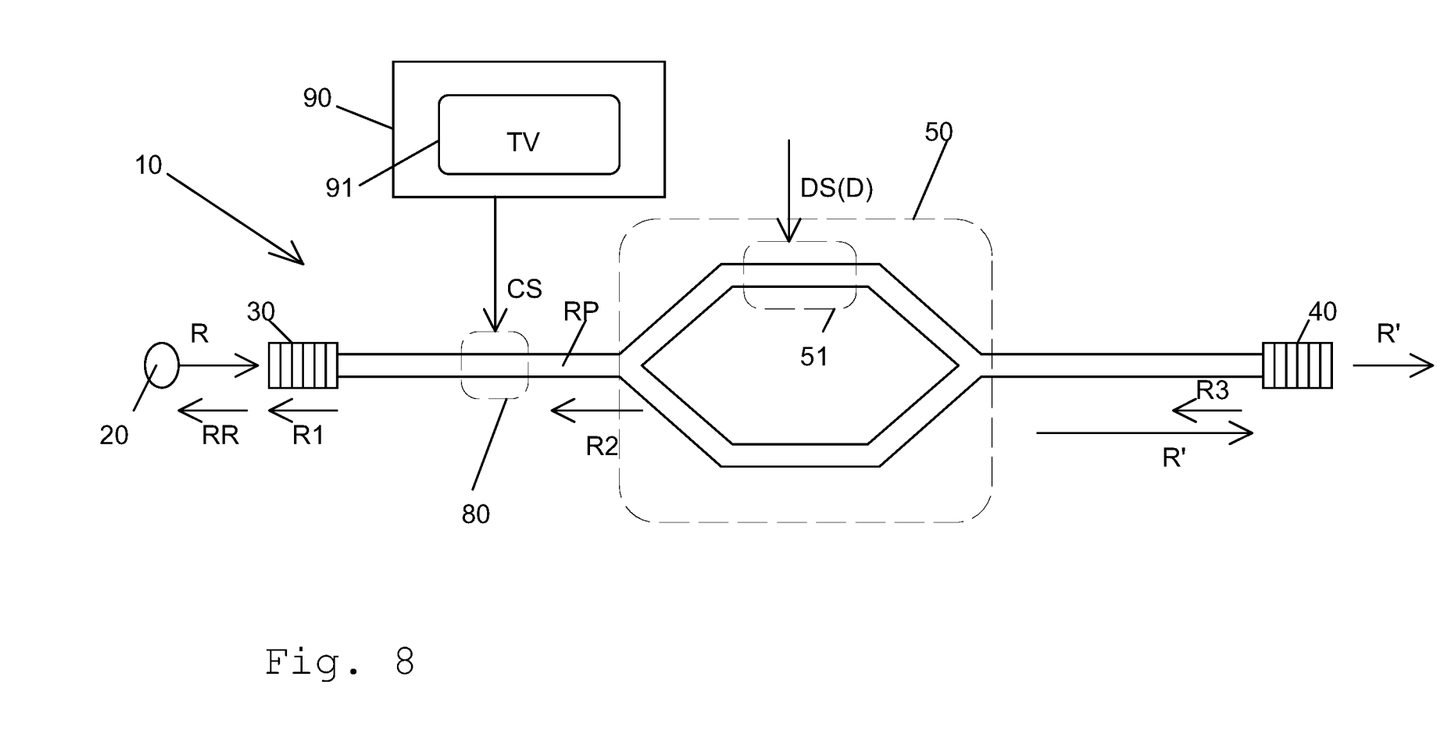

FIG. 8 shows a seventh exemplary embodiment of an optical signal generator 10 according to the present invention. In the exemplary embodiment of FIG. 8, the optical signal generator 10 comprises a control unit 90 that generates an invariant control signal CS according to the corresponding target value TV stored in a memory 91.

The target value TV has been determined and stored in the memory 91 during the fabrication of the optical signal generator 10. The target phase-shift is chosen such that the impact of reflected radiation RR on the emitter's emission characteristic is minimal.

During the fabrication of the optical signal generator 10 the emitter's emission characteristic may have been measured by an external monitor detector for different phase shifts. In this way, the optimal phase-shift may have been determined. The optimal phase shift, i.e. the target value TV, and the corresponding control signal CS are stored in the memory 91.

In the exemplary embodiments of FIGS. 1-8, the modulator 50 is a Mach-Zehnder modulator. The 1×2-couplers 52 and 53 (see FIG. 1) at the input port and output port of the Mach-Zehnder modulator are preferably MMI (multi-mode interference) couplers.

Figure 9:
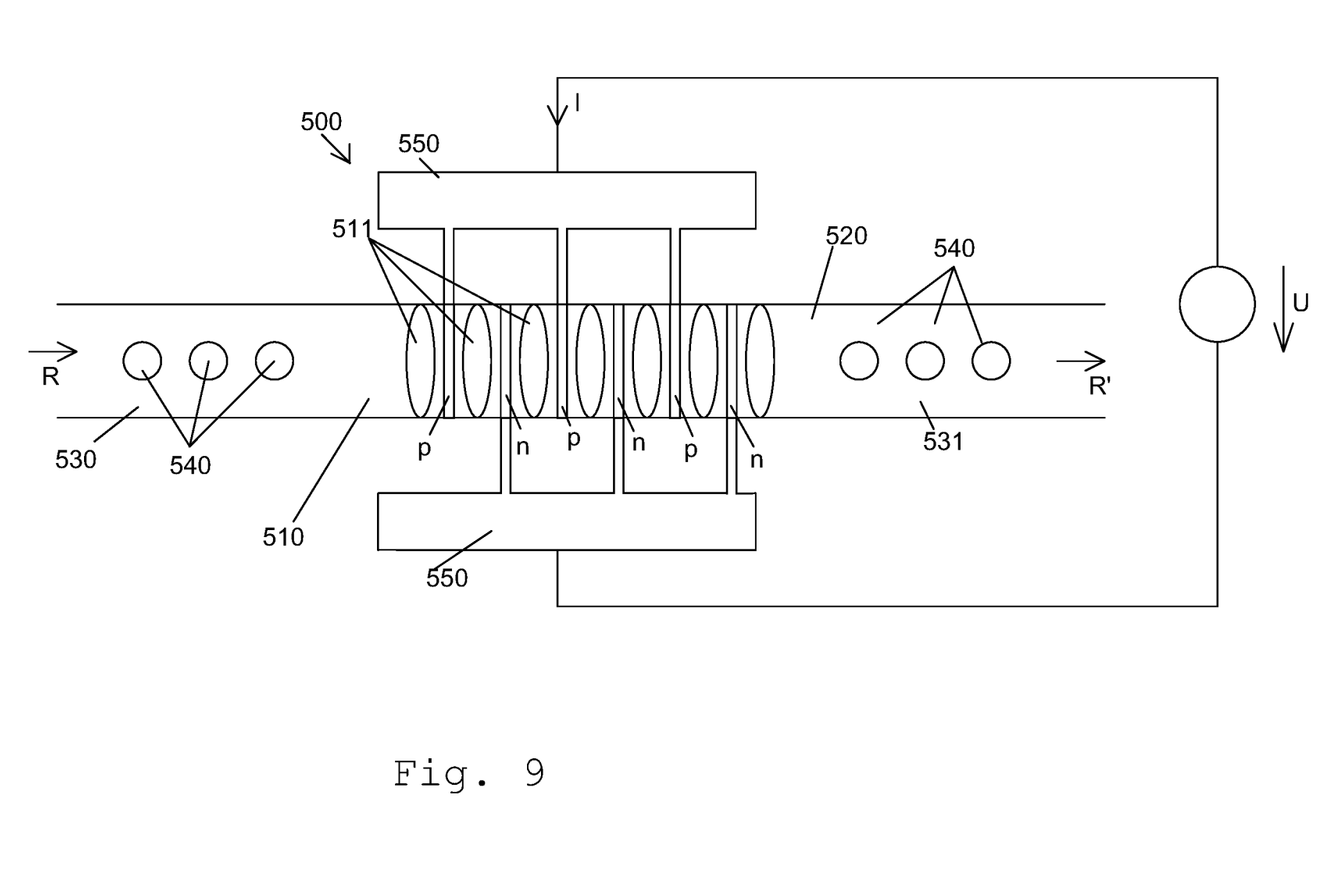
FIG. 9 illustrates another embodiment of a modulator that can be used in the exemplary embodiments of FIGS. 1-8.

FIG. 9 shows an alternative embodiment of a modulator which can be used in the optical signal generators 10 according to FIGS. 1-8 (instead of the Mach-Zehnder modulator). More specifically, FIG. 9 shows an electro-optic modulator 500 that is configured for the modulation of the optical radiation R at a predetermined wavelength.

The electro-optic modulator 500 has an optical resonator 510 in which a standing optical wave 511 can be formed for the predetermined wavelength. A SOI (silicon-on-insulator) waveguide 520 extends along the longitudinal direction of the resonator 510. The resonator 510 is delimited by mirror sections 530 and 531, which are formed by holes 540 in the SOI waveguide 520.

In the resonator 510, p-doped semiconductor sections p and n-doped section n, as seen in the longitudinal direction of the resonator 510, are arranged at a distance from one another. Each doped semiconductor section lies locally at an intensity minimum of the standing optical wave. By applying a modulated voltage U at contacts 550 a modulated current I is generated. The current I injects carriers which modulate the resonance wavelength of the resonator 510 and therefore the amplitude of the output radiation R'. The modulated voltage U may consist of a bias voltage and the external electrical data signal DS (D) (see FIG. 10).

Figure 10:
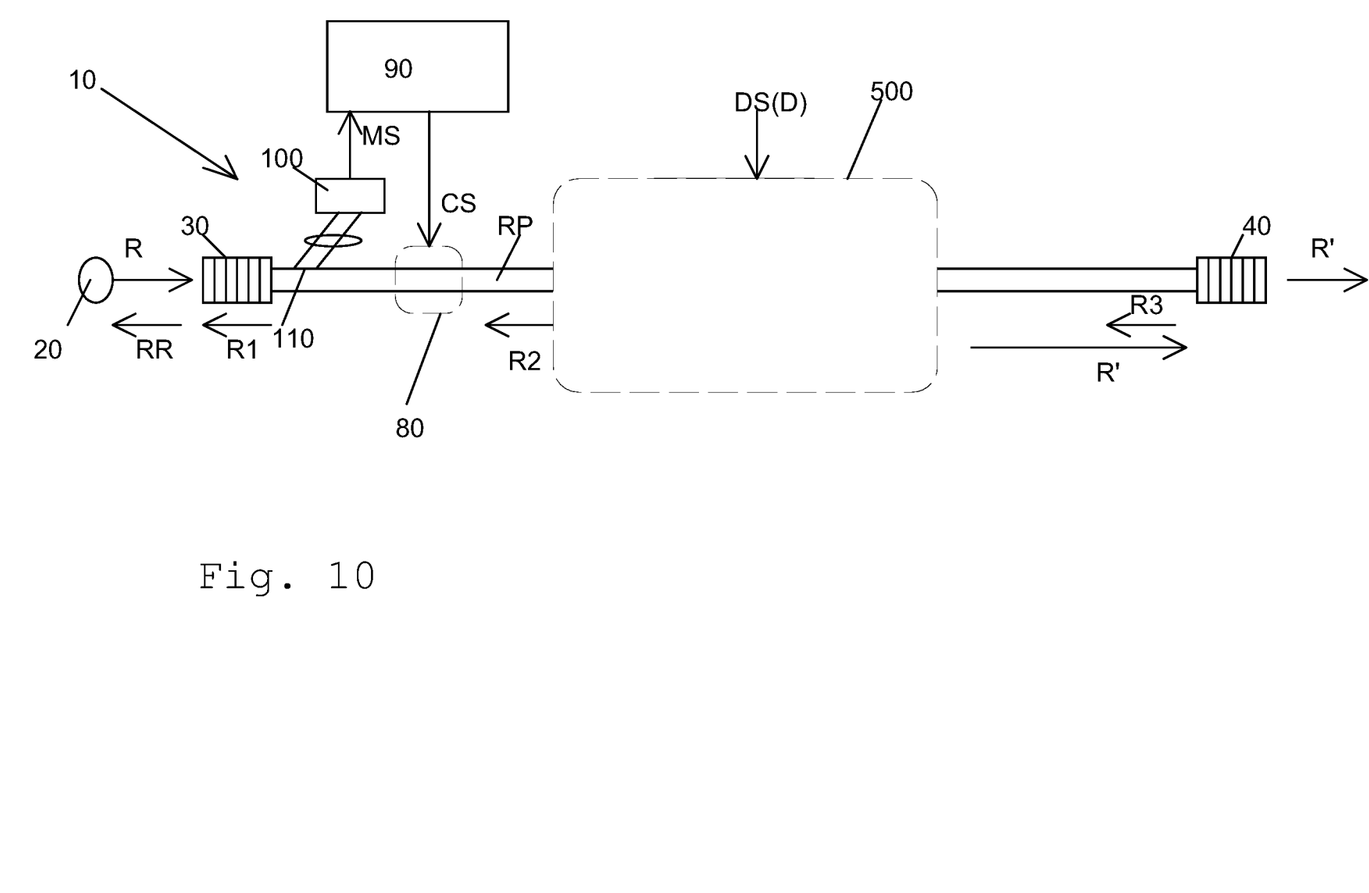
FIG. 10 illustrates an exemplary embodiment of an optical signal generator that comprises the modulator of FIG. 9.

FIG. 10 shows an exemplary embodiment of an optical signal generators 10 that comprises the electro-optic modulator 500 of FIG. 9. Since the mirror sections 530 and 531 may generate a significant amount of reflected radiation R2, the phase shifter 80 is preferably located upstream the modulator 500.

The various embodiments and aspects of embodiments of the invention disclosed herein are to be understood not only in the order and context specifically described in this specification, but to include any order and any combination thereof. Whenever the context requires, all words used in the singular number shall be deemed to include the plural and vice versa. Whenever the context requires, all options that are listed with the word "and" shall be deemed to include the world "or" and vice versa, and any combination thereof.

In the drawings and specification, there have been disclosed a plurality of embodiments of the present invention. The applicant would like to emphasize that each feature of each embodiment may be combined with or added to any other of the embodiments in order to modify the respective embodiment and create additional embodiments. These additional embodiments form a part of the present disclosure and, therefore, the applicant may file further patent claims regarding these additional embodiments at a later stage of the prosecution.

Further, the applicant would like to emphasize that each feature of each of the following dependent claims may be combined with any of the present independent claims (regardless of the present claim structure). Therefore, the applicant may direct further patent claims towards other claim combinations at a later stage of the prosecution.

REFERENCE SIGNS

10 optical signal generator
20 optical emitter
30 first beam deflecting element
40 second beam deflecting element
50 modulator
51 carrier injection or depletion unit
52 1×2-coupler
53 1×2-coupler
60 semiconductor chip
61 waveguiding silicon layer
62 lens
63 backend layer
64 lens
65 silicon substrate
66 buried oxide layer
70 submount
80 phase shifter
90 control unit
91 memory
100 monitor detector
110 coupling element
120 bandpass filter
200 temperature sensor
500 electro-optic modulator
510 resonator
511 standing optical wave
520 SOI waveguide
530 mirror section
531 mirror section
540 holes
550 contact
A10 output port
CS control signal
D data stream
DS(D) external electrical data signal
E plane
I current
LT look-up table
MS monitor signal
n n-doped section
p p-doped section
R optical radiation
R1 reflected radiation
R2 reflected radiation
R3 reflected radiation
R' modulated radiation
RR reflected radiation
RP path
T temperature value
TV target value
U voltage

The invention claimed is:

1. Optical signal generator comprising
   an optical emitter configured to generate a beam of optical radiation,
   a first and second beam deflecting element,
   a modulator being located between the beam deflecting elements, a phase shifter located between the beam deflecting elements, a control unit configured to control the phase-shift of the phase shifter, wherein the first and second beam deflecting elements, the phase shifter and the modulator are located in the same plane, wherein the beam generated by the optical emitter is angled relative to said plane, wherein said first beam deflecting element is configured to deflect the emitter's beam into the plane towards the modulator, said modulator being configured to modulate the emitter's radiation and outputting a modulated radiation, wherein said second beam deflecting element is configured to deflect the modulated radiation off the plane towards an output port of the signal generator, wherein the modulator is configured to modulate the emitter's radiation in response to an electrical data signal that is applied to the modulator and comprises a data stream, and wherein the control unit is configured to generate a control signal in order to control the phase-shift of the phase shifter and in order to avoid or reduce an impact of reflected radiation on the emitter's emission characteristic.

2. Optical signal generator according to claim 1 wherein the cut-off frequency of the phase shifter is smaller than the cut-off frequency of the modulator.

3. Optical signal generator according to claim 2 wherein the cut-off frequency of the phase shifter is at least a thousand times smaller than the cut-off frequency of the modulator.

4. Optical signal generator according to claim 1 wherein the optical signal generator comprises a monitor detector for generating a monitor signal that is proportional to the emitter's radiation or at least characterizes the emitter's radiation, and wherein the control unit is configured to control the phase-shift of the phase shifter such that a predefined characteristic of the monitor signal and therefore of the emitter's radiation remains inside a predefined range.

5. Optical signal generator according to claim 4 wherein the control unit is configured to control the phase-shift of the phase shifter such that the intensity of the monitor signal remains inside a predefined intensity range.

6. Optical signal generator according to claim 4 wherein a bandpass filter having a center wavelength is located upstream the monitor detector.

7. Optical signal generator according to claim 4 wherein the monitor detector is connected to or coupled with a radiation path that extends from the first beam deflecting element to the second beam deflecting element, and wherein the monitor detector is configured to detect a portion of the emitter's radiation.

8. Optical signal generator according to claim 4 wherein the first or second beam deflecting element has a monitor output and wherein the monitor detector is optically coupled with said monitor output.

9. Optical signal generator according to claim 1 wherein the signal generator comprises a temperature sensor and wherein a control unit is configured to control the phase-shift of the phase shifter as a function of a temperature value provided by the temperature sensor.

10. Optical signal generator according to claim 9 wherein the signal generator comprises a memory storing a look-up table which defines a target value that depends on the actual temperature value of the temperature sensor, and wherein the target value describes the optimal phase-shift of the phase shifter, the optimal control voltage that causes the optimal phase-shift, or an optimal control current that causes the optimal phase-shift.

11. Optical signal generator according to claim 1 wherein the signal generator comprises a memory where a target value is stored and wherein a control unit is configured to control the phase-shift of the phase shifter according to the stored target value.

12. Optical signal generator according to claim 11 wherein an optimal phase-shift of the phase shifter that avoids or reduces the reflected radiation or its impact on the emitter's output characteristic has been determined during the fabrication of the signal generator, and wherein said target value describes the optimal phase-shift of the phase shifter, an optimal control voltage that causes the optimal phase-shift, or an optimal control current that causes the optimal phase-shift.

13. Optical signal generator according to claim 1 wherein at least one phase shifter is located downstream the modulator and configured to shift the phase of radiation that is reflected by the second beam deflecting element.

14. Optical signal generator according to claim 1 wherein at least one phase shifter is located upstream the modulator and configured to shift the phase of radiation that is reflected by both the modulator and the second beam deflecting element.

15. Optical signal generator according to claim 1 wherein the first beam deflecting element is a first grating that is arranged inside said plane, wherein the emitter's radiation is directed towards the first grating at an input angle between 10° and 30° with respect to said plane, and wherein the grating period of the first grating is configured for coupling the emitter's radiation into said plane.

16. Optical signal generator according to claim 1 wherein the second beam deflecting element is a grating that is arranged inside said plane, and wherein the grating has a grating period for out-of-plane coupling at an output angle between 10° and 30° with respect to the perpendicular of said plane.

17. Optical signal generator according to claim 1 wherein the first and second beam deflecting elements and the modulator are integrated in the same semiconductor chip.

18. Optical signal generator according to claim 17 wherein the emitter is a laser that is flip-chip mounted on said semiconductor chip.

19. Optical signal generator according to claim 17 wherein the emitter is a laser that is mounted on said semiconductor chip by means of a submount.

20. Optical signal generator according to claim 17 wherein the first and second beam deflecting elements and the modulator share the same waveguiding silicon layer.

21. Optical signal generator according to claim 1 wherein said optical emitter is a continuous wave laser.

22. Optical signal generator according to claim 1 wherein the modulator is a Mach-Zehnder modulator comprising at least one MMI coupler.

23. Optical signal generator according to claim 1 wherein the modulator is an electro-optic modulator for the modulation of the optical radiation of a predetermined wavelength, the electro-optic modulator having at least one optical resonator in which a standing optical wave can be formed for the predetermined wavelength, wherein in the resonator, at least two doped semiconductor sections, as seen in the longitudinal direction of the resonator, are arranged at a distance from one another, and the at least two doped semiconductor sections respectively lie locally at an intensity minimum of the standing optical wave; and wherein a light waveguide consisting of semiconductor material is present in the resonator, the longitudinal direction of the light waveguide extends along the longitudinal direction of the resonator, and the at least two doped semiconductor sections are respectively formed by a doped semiconductor section of the light waveguide.

24. Optical signal generator according to claim 1 wherein the phase shifter comprises a thermal element capable of shifting the phase on the basis of the thermo-optic effect.

25. Optical signal generator according to claim 1 wherein the signal generator comprises two or more phase shifters located between the first and second beam deflecting elements, and wherein each of two or more phase shifters is controlled individually.

26. Optical signal generator according to claim 1 further comprising a lens that is located in the beam path between the emitter and the first beam deflecting element, wherein the lens is formed in at least one backend layer of the semiconductor chip.

* * * * *